(12) United States Patent
Li et al.

(10) Patent No.: US 8,097,934 B1
(45) Date of Patent: Jan. 17, 2012

(54) DELAMINATION RESISTANT DEVICE PACKAGE HAVING LOW MOISTURE SENSITIVITY

(75) Inventors: Felix C. Li, Sunnyvale, CA (US); Yee Kim Lee, Segamat (MY); Peng Soon Lim, Melaka (MY); Terh Kuen Yii, Kuala Lumpur (MY); Lee Han Meng@Eugene Lee, Muar (MY)

(73) Assignee: National Semiconductor Corporation, Santa Clara, CA (US)

( * ) Notice: Subject to any disclaimer, the term of this patent is extended or adjusted under 35 U.S.C. 154(b) by 691 days.

(21) Appl. No.: 12/191,158

(22) Filed: Aug. 13, 2008

Related U.S. Application Data (63) Continuation-in-part of application No. 11/862,787, filed on Sep. 27, 2007, now Pat. No. 7,838,980.

(51) Int. Cl.
  *H01L 23/495* (2006.01)

(52) U.S. Cl. ........ 257/667; 257/669; 257/670; 257/676; 257/E23.013; 257/E23.047; 257/E23.048

(58) Field of Classification Search .................. 257/667, 257/669, 670, 676, E23.011, E23.013, E23.047, 257/E23.048
See application file for complete search history.

(56) References Cited

U.S. PATENT DOCUMENTS

| | | | | |
|---|---|---|---|---|
| 6,054,754 A * | 4/2000 | Bissey | ............................ | 257/666 |
| 6,083,776 A * | 7/2000 | Manteghi | ....................... | 438/123 |
| 6,284,309 B1 | 9/2001 | Bishop et al. | | |
| 6,331,728 B1 | 12/2001 | Chang et al. | | |
| 6,504,236 B2 * | 1/2003 | Bissey | ............................ | 257/666 |
| 6,525,406 B1 | 2/2003 | Chung et al. | | |
| 6,576,491 B1 | 6/2003 | Chang et al. | | |
| 6,818,968 B1 * | 11/2004 | Cheah | ............................ | 257/666 |
| 6,876,069 B2 * | 4/2005 | Punzalan et al. | .............. | 257/676 |
| 6,963,125 B2 * | 11/2005 | Featherby et al. | ............ | 257/680 |
| 7,019,389 B2 * | 3/2006 | Lai et al. | ........................ | 257/666 |
| 7,078,809 B2 | 7/2006 | Yap et al. | | |
| 7,102,218 B2 * | 9/2006 | Huang et al. | ................... | 257/686 |
| 7,339,257 B2 * | 3/2008 | Ozawa et al. | ................... | 257/666 |
| 7,427,813 B1 * | 9/2008 | Wang et al. | ..................... | 257/790 |
| 7,466,024 B2 * | 12/2008 | Ito et al. | ........................ | 257/724 |
| 7,598,603 B2 * | 10/2009 | Otremba | ........................ | 257/675 |
| 7,663,246 B2 * | 2/2010 | Chen et al. | ..................... | 257/777 |
| 7,671,432 B2 * | 3/2010 | Fujii | ................................ | 257/419 |
| 7,772,044 B2 * | 8/2010 | Ito et al. | ........................ | 438/123 |
| 7,808,087 B2 * | 10/2010 | Zhao et al. | ..................... | 257/670 |
| 7,834,436 B2 * | 11/2010 | Chen | ............................ | 257/676 |
| 2001/0040300 A1 * | 11/2001 | Huang et al. | ................... | 257/787 |
| 2001/0048149 A1 * | 12/2001 | Cheng et al. | ................... | 257/672 |

(Continued)

*Primary Examiner* — Ngan Ngo
(74) *Attorney, Agent, or Firm* — Beyer Law Group LLP (57) ABSTRACT

A lead frame and package construction configured to attain a thin profile and low moisture sensitivity. Lead frames of this invention may include a die attach pad having a die attachment site and an elongate ground lead that extends from the die attach pad. The lead frame includes a plurality of elongate I/O leads arranged about the die attach pad and extending away from the die attach pad in at least two directions. An inventive lead frame features "up-set" bonding pads electrically connected with the die attach pad and arranged with a bonding surface for supporting a plurality of wire bonds. The bonding surfaces also constructed to define at least one mold flow aperture for each up-set bonding pad. A package incorporating the lead frame is further disclosed such that the package includes an encapsulant that surrounds the bonding support and flows through the mold flow aperture to establish well supported wire bonds such that the package has low moisture sensitivity. Such packages can be constructed in single inline configuration, dual inline configuration, quad package configurations.

42 Claims, 5 Drawing Sheets

U.S. PATENT DOCUMENTS

| | | | |
|---|---|---|---|
| 2002/0024122 A1* | 2/2002 | Jung et al. | 257/666 |
| 2002/0056903 A1* | 5/2002 | Li et al. | 257/691 |
| 2003/0013235 A1* | 1/2003 | Featherby et al. | 438/127 |
| 2003/0038356 A1* | 2/2003 | Derderian | 257/686 |
| 2003/0160309 A1* | 8/2003 | Punzalan et al. | 257/676 |
| 2003/0227076 A1* | 12/2003 | Sugimori | 257/670 |
| 2004/0011699 A1* | 1/2004 | Park | 206/710 |
| 2004/0099931 A1* | 5/2004 | Huang et al. | 257/666 |
| 2004/0256707 A1* | 12/2004 | Sugimori | 257/678 |
| 2005/0051877 A1* | 3/2005 | Hsu | 257/667 |
| 2005/0098860 A1* | 5/2005 | Lai et al. | 257/666 |
| 2005/0230796 A1* | 10/2005 | Sakamoto et al. | 257/678 |
| 2006/0006510 A1* | 1/2006 | Koduri | 257/678 |
| 2006/0103002 A1* | 5/2006 | Ahn et al. | 257/692 |
| 2006/0110858 A1* | 5/2006 | Ahn et al. | 438/123 |
| 2007/0035017 A1* | 2/2007 | Ito et al. | 257/724 |
| 2007/0120237 A1* | 5/2007 | Sakamoto et al. | 257/676 |
| 2007/0158822 A1* | 7/2007 | Fujii | 257/704 |
| 2007/0215996 A1* | 9/2007 | Otremba | 257/678 |
| 2007/0278632 A1* | 12/2007 | Zhao et al. | 257/676 |
| 2007/0296077 A1* | 12/2007 | Moline | 257/712 |
| 2008/0017977 A1* | 1/2008 | Tseng et al. | 257/712 |
| 2008/0099896 A1* | 5/2008 | Shen et al. | 257/676 |
| 2009/0020860 A1* | 1/2009 | Takahashi | 257/670 |
| 2009/0061563 A1* | 3/2009 | Ito et al. | 438/111 |
| 2009/0230520 A1* | 9/2009 | Lee et al. | 257/666 |
| 2009/0302442 A1* | 12/2009 | Camacho et al. | 257/667 |
| 2010/0029046 A1* | 2/2010 | Camacho et al. | 438/118 |
| 2010/0035383 A1* | 2/2010 | Zhao et al. | 438/119 |

* cited by examiner

DELAMINATION RESISTANT DEVICE PACKAGE HAVING LOW MOISTURE SENSITIVITY

RELATED APPLICATION

This invention is a continuation-in-part of U.S. patent application Ser. No. 11/862,787 entitled "TO263 Device Package Having Low Moisture Sensitivity" by Yee Kim Lee, et al., filed on Sep. 27, 2007. The foregoing application is hereby incorporated by reference in its entirety for all purposes.

TECHNICAL FIELD

The invention described herein relates generally to semiconductor device packaging and associated lead frames. In particular, the invention relates to cost effective and delamination resistant packages and packaging methods that provide low moisture sensitivity when implemented in dual inline and quad pack implementations. The principles herein are also applicable to other semiconductor packages and devices.

BACKGROUND

"Dual in-line" packages and "quad flat pack" semiconductor packages describe a families of semiconductor devices that facilitate a number of high power applications. These designations identify families of surface mounted multi-lead devices that can operate as regulatable power supplies as well as operate in other capacities well known to those having ordinary skill in the art.

Figure 1:
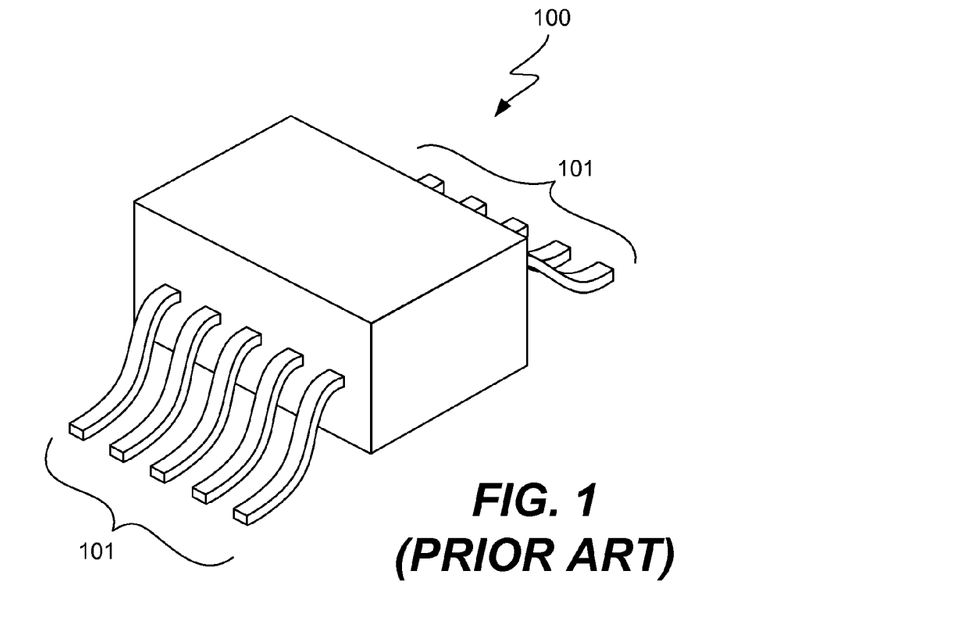
FIG. 1 is a perspective external view of an example prior art dual inline type package.

FIG. 1 illustrates one example of a prior art dual inline implementation (100) having leads that extend out of two opposite sides of the package. The embodiment depicted here has five leads 101 on each side. Other packages can be implemented using many different lead configurations having a varying number of leads on each side.

Users have encountered a number of device failure mechanisms in the field and also report that existing package configurations suffer from a high sensitivity to moisture during reflow process or other operational environments. For these and other reasons, an improved design of such packages would be helpful in the industry.

SUMMARY OF THE INVENTION

In accordance with the principles of the present invention, package configurations methodologies are disclosed.

In one embodiment, a lead frame for a high power surface mounted semiconductor package is described. One such lead frame includes a die attach pad having a die attachment site and at least one ground lead and a plurality of I/O leads arranged about the die attach pad. Such leads may be configured as input/output leads. Also such leads may be arranged with bonding portions in a lead plane arranged above the die attach pad. The lead frame further includes an up-set bonding pad that is electrically connected with the die attach pad that includes a bonding support in the lead plane and configured to support a plurality of wire bonds and arranged to include a mold flow aperture between the die attachment site and the bonding support. Such lead frames can be configured to accommodate single inline, dual inline, and quad packages.

Another embodiment describes a high power surface mounted semiconductor package including a lead frame, an IC mounted to the lead frame, a set of wire bonds that electrically connect the lead frame to the IC, and a mold envelope for encasing the IC, the wire bonds and portions of the lead frame. The lead frame configured to include a die attach pad having a die attachment site upon which the IC is mounted and at least one ground lead and a plurality of I/O leads arranged about the die attach pad and extending out two or four sides of the package to enable a dual inline or quad package configuration. The lead frame further includes one or more up-set bonding pads electrically connected with the die attach pad and including a bonding surface configured to support at least some of the wire bonds and arranged to include mold flow aperture between the die attachment site and the bonding surface such that the mold material of the mold envelope flows through the aperture encapsulating the package with the mold material, the envelope encapsulating the die; an upper portion of the attach pad; portions of the ground leads; portions of the I/O leads, the up-set bonding pad; and the set of wire bonds and wherein the mold materials fills the mold flow aperture to form a mold locking feature.

These and other aspects of the present invention are described in greater detail in the following detailed description of the drawings set forth hereinbelow.

BRIEF DESCRIPTION OF THE DRAWINGS

The following detailed description will be more readily understood in conjunction with the accompanying drawings, in which:

FIGS. 4 (a) and 4(b) are plan and cross-sectional views of a portion of a dual inline device package embodiment constructed in accordance with the principles of the invention.

FIGS. 6 (a) and 6(b) are plan and cross-sectional views of a portion of a quad device package embodiment illustrating a bond surface defining a plural mold aperture in accordance with the principles of the invention.

It is to be understood that, in the drawings, like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following language describes various embodiments of semiconductor packages and construction methodologies. Also described is a related lead frame suitable for use in IC packaging implementations such as those disclosed herein. In particular, the disclosed embodiments describe a lead frame and associated package implementations leading to the construction of a thin profile low moisture sensitivity package. Such packages include, but are not limited to, single in-line packages (such as the TO263), dual in-line device packages as well as quad packages.

In one example, a package capable of operating in a high power environment is described. An embodiment of such a package includes a high-power, metal-oxide-semiconductor field effect transistor ("MOSFET") device. In one example of such a device, a number of lower-power devices can be formed in a single semiconductor die, or "chip," and the respective "gate" and "source" terminals of the devices are all formed on the top of the die and respectively connected in parallel by thin metal pads on the top surface of the die, which in turn, are internally connected, typically by wire bonds, to respective leads of the device package.

The "drain" terminals of the individual devices are all respectively formed on the bottom of the die, and are connected in parallel by a thin metal pad on the bottom surface of the die, which in turn, is internally connected, typically by solder, to a metal die-mounting pad, which then constitutes a third "lead," or terminal, of the package. Other types of two- and three-terminal, high-power electronic devices can be made in a similar fashion. The inventors specifically note that the principles of the invention are not limited to such packages, but cover a numbers of related devices as readily apparent to those of ordinary skill.

In one implementation, the inventors propose a replacement package and structure for use in many applications. In a particular embodiment, the inventors contemplate the use of a lead frame and package construction of the present invention in single in-line, dual in-line, and quad pack package formats as well as other package formats.

The inventors point out that one failure mode plaguing existing packages is the existence of so-called "delamination" failures which can degrade or destroy the electrical connections within IC packages. In one example, the inventors point out that such delamination failures can be especially problematic during reflow and other high temperature processes or operations.

Figure 2:
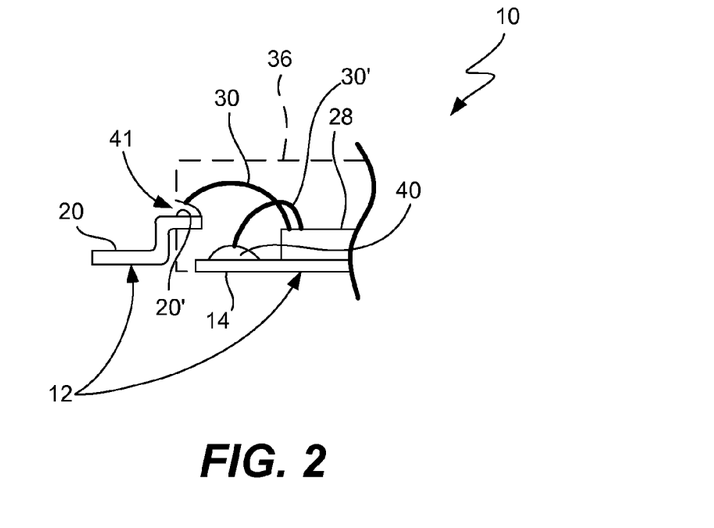
FIG. 2 is a cross-sectional view of a package showing the effects of delamination defects.

FIG. 2 illustrates a failure mode illustrated with respect to an example package illustrated by a cross-section view of one side of a dual in-line package 10. For example, the package can be a surface-mounting, highpower, leadframe semiconductor package 10 such as a SOIC (small outline integrated circuit) package. A protective plastic envelope 36 is molded over a device 28 (shown here by a dashed line that reveals the underlying package details). In some implementations, the package 10 is sometimes referred to as a "Dpak" package similar to other standardized surface-mounting packages of a known type in the industry.

A lead frame 12 of the standard package 10 comprises a rectangular die pad 14, a plurality of leads shown here in example cross-section view by lead 20 that are typically die-stamped from a dual-gage metal sheet, e.g., copper. A semiconductor die 28 incorporating an electronic device of the type described above is mounted on the upper surface of the die pad 14 with its lower surface in electrical connection with the pad 14. A plurality of wire bonds 30 are connected between bonding pads on the upper surface of the die 28 and wire bonding arms 20' at the ends of each of the leads 20. Additionally, in a typical application, at least one wire bond 30' is connected from the die 28 to the die pad 14. A protective plastic envelope 36 is molded over the leadframe 12, die 28, and wire bonds 30, 30'. A lower (bottom) surface of the die pad 14 is exposed and flush with the envelope to constitute a set of electrical contacts in addition to the previously mentioned leads 20.

While such packages 10 provide a workable housing and mounting for the above-described types of high-power devices, they also suffer from a few operational shortcomings that the inventors seek to remedy. This moisture sensitivity is particularly problematic during solder reflow processes. Accordingly, as currently manufactured, many of these packages are released subject to JEDEC Moisture Sensitivity Level 3 (as defined by Joint Electronic Devices Engineering Council (JEDEC) J-STD-020 industry testing standards; also known as "MSL3") handling guidelines. Such handling guidelines place significant restraints on the process conditions employed with the packages. Moreover, these shortcomings are exacerbated in packages that employ ground bonding (i.e., where ground connections of the die are wire bonded to the die attach pad (DAP) (See, e.g., 30' FIG. 2)).

Due to this sensitivity to moisture, existing packages suffer from a number of known failure modes. The inventors point out that one particular cause for concern is the aforementioned delamination failure. This failure mode will be further articulated with reference to FIG. 2. FIG. 2 depicts a simplified cross-section view of an existing TO263 package 10 that has undergone a delamination failure. As explained above, the package 10 includes a die 28 attached to a die attach pad 14 and a series of leads 20. The die 28 is electrically connected to the lead 20 using a wire bond 30 and also a wire contact "ground bond" 30' intended to electrically connect the die to the die attach pad 14. The die, the die attach pad, the wire bonds, and portions of the leads are all encapsulated with plastic material 36.

During repeated thermal cycling, handling stress, and other processing and usage strains on the package, delaminations can occur in the composite material used to encapsulate 36 the package. Referring again to FIG. 2, the illustration shows aspects of these delamination problems. Failure analysis has revealed that delaminations can occur at many locations within the package. However, extremely problematic are delaminations that occur between the encapsulate 36 and the die attach pad 14. One such defect of this type is identified as defect 40. Other types of delamination defects are problematic.

With continuing reference to FIG. 2 two types of delamination defects 40, 41 are illustrated. As mentioned above, in one common case, the encapsulant 36 can delaminate 40 from the die attach pad 14. With this type of separation or delamination the extremely fragile wire bond connection 30' at the die attach pad 14 can also become cracked or broken, leading to an electrical failure for the associated connection. Another delamination failure mode can occur at the interface between encapsulant 36 and the leads 20. This is illustrated by delamination 41 which also can lead to a cracking or separation of the wire bond 30 from the lead 20 causing another electrical failure. These modes of failure can occur due to the thermal mismatch between the encapsulant 36 and the die attach pad 14, the leads 20, or other electrically connected elements. These types of failure are particularly common after Moisture Sensitivity Level testing, indicating package sensitivity to heat and moisture conditions. This sensitivity to moisture is particularly troublesome because it can limit the process conditions that can be employed when using or processing the packages. Particularly problematic is the role this moisture sensitivity plays in limiting reflow processes. Current packages are severely limited by the MSL3 limitations of the packages. Accordingly, such existing packages can only be used under a narrow range of conditions. The inventors have discovered new lead frames and package configurations that enable a more robust device package enabling an exposure to a wider range of process conditions.

Figure 3A:
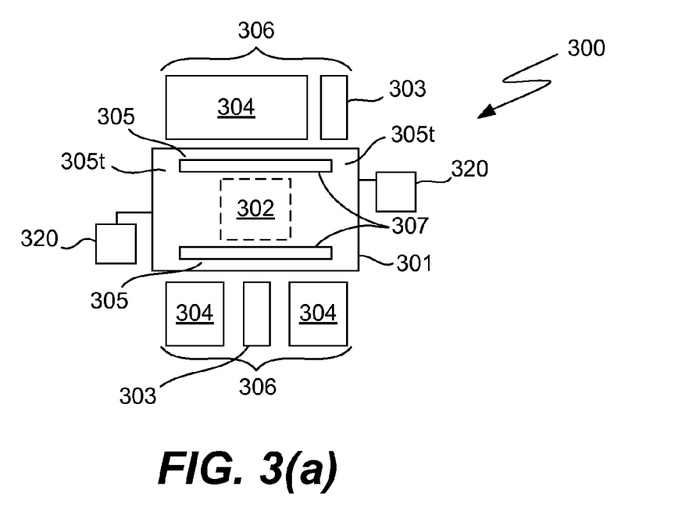
FIG. 3(a) is plan schematic view of a dual inline lead frame embodiment constructed in accordance with the principles of the invention.

FIG. 3(a) is a schematic block depiction one embodiment of a lead frame implementation suitable for use with dual in-line application of the invention. Such a lead frame can be used for surface mounted semiconductor packages. This is especially useful with small profile packages. For example, such small outline packages generally have 30-50% of the area of standard configuration packages and thicknesses about 70% less of standard configuration packages. Typical examples of such packages include SOIC packages, SO (small outline) packages, PSOP's (plastic small outline packages), TSOP's (Thin Small-Outline Package), (SSOP) Shrink Small-Outline Package, or TSSOP's (Thin-Shrink Small Outline Package) and can be applied to many other packages. The lead frame 300 is formed of a conductive material (e.g. metal) and in one particular embodiment is made from a copper material. The lead frame 300 includes a die attach pad 301 having a die attachment site 302 and at least one ground lead 303 that extends from the pad. The leads can extend from either of opposing side edges 311, 312 or in some embodiments they can extend from the ends. Typically, the ground leads form a part of the die attach pad 301. In some embodiments, they can be physically disconnected from the die attach pad but electrically connected via wire bonds.

Continuing with a description of FIG. 3(a), the lead frame 300 further includes a plurality of I/O leads that extend out from the die attach pad so that they can protrude from a final encapsulated package on either side of the die attach pad 301. The I/O leads 304 and the ground leads 303 can collectively be referred to as leads or contacts 306. In common embodiments, each side includes at least two leads 306. Common implementations include at least eight leads 306. Example, applications include, but are not limited to, 8, 12, 14, 15, 20, 24, 28, 44, 48, or 56 lead embodiments.

The lead frame 300 further includes at least one "up-set" bonding pad 305 that is electrically connected with the die attach pad 301. This depicted embodiment includes two up-set bonding pads 305, one on each of the opposed sides of the die attach pad 301. As shown here, the "up-set" bonding pads 305 are electrically and structurally connected to the die attach pad 301 using conductive tabs 305t. The up-set bonding pad 305 includes a bonding surface configured to support a plurality of wire bonds and also includes a large mold flow aperture 307 between the die attachment site 302 and the bonding surface. The presence of the mold flow apertures enable large flows of encapsulant (epoxy, plastic, or other molding material) to flow through the apertures and surround the up-set bonding pads 305 and bonding surfaces as well as any associated wires bonded to the bonding surfaces. Thus, upon curing, the encapsulant provides a mechanical locking effect which increases resistance to delamination. This increases the structural integrity of the resultant package and greatly improves the moisture resistance of the package. The hardened encapsulant forms wedge bonds that stabilize the encapsulant in the regions near the up-set bonding pads. This supports and strengthens the associated wire bond connections and prevents delamination and the associated separating and failure of the wire bonds.

The inventors point out that embodiments of the lead frame 300 further include tie bars that temporarily couple the leads 306 to the lead frame 300. For example a temporary tie bar can connect the I/O leads 304 to the ground leads 303. Alternatively, more than one tie bar can be used to temporarily couple the leads 306 together with the die attach pad. Once the lead frame 300 is assembled and encapsulated, the tie bars can be easily cut away leaving the leads 306 extending outward from the package.

In some embodiments of the invention the lead frame further includes one or more holding features 320 that extend from and are typically attached to the die attach pad 301 enabling the lead frame to be secured to a mounting jig. This will enable, among other things, effective mounting of a die onto the die attach pad, effective wire bonding, and effective encapsulation to form the final package. In the embodiment depicted in FIG. 3, the lead frame 300 is shown with two schematically depicted holding features 320. More (or fewer) can be added in accordance with the needs of the associated lead frame. As will be apparent to those of ordinary skill, many different holding features can be employed in accordance with the invention.

Finally, the inventors point out that in some embodiments of the invention the leadframe is configured such that the bonding surface of the up-set bonding pad 305 is elevated above the plane defined by the die attach pad 301. In one example, the bonding support 305 is supported above the die attach plane by the conductive tabs 305t. Moreover, a bonding surface of the ground lead 303 can also be raised above the plane defined by the die attach pad 301. Additionally, portions of the I/O leads 304 can also be elevated above the die attach plane. The invention does not require these portions of the lead frame to be raised. However, the inventors suggest that in some embodiments of the invention, these raised features can be employed to advantageous effect.

Figure 3B:
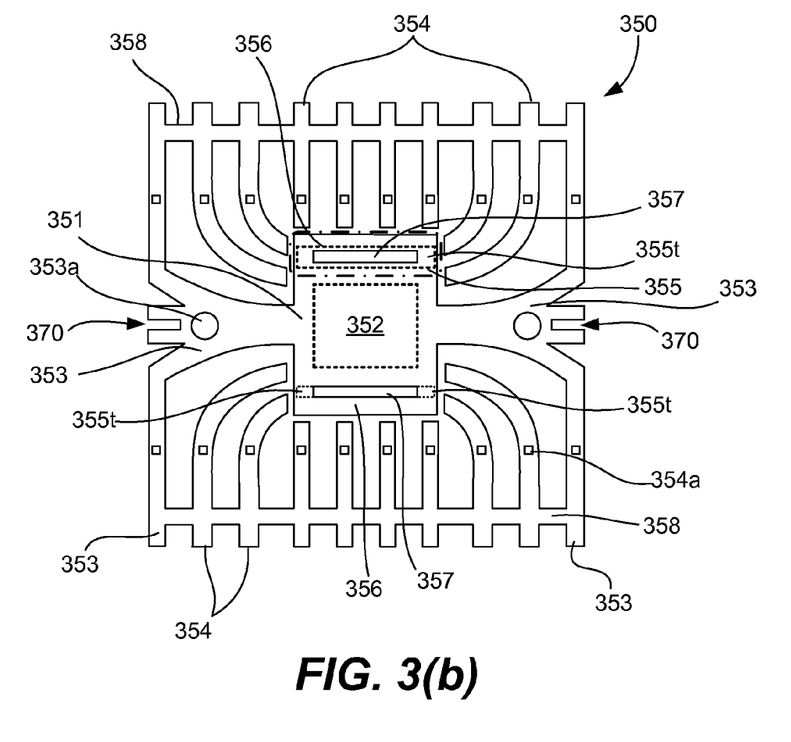
FIG. 3(b) is plan figurative view of a dual inline lead frame embodiment constructed in accordance with the principles of the invention.

In one example, FIG. 3(b) describes a typical molded dual in-line package (DIP) lead frame suitable for use in accordance with the principles of the invention. The example lead frame 350 is formed of a conductive material (e.g. metal). Commonly, but not exclusively, this is a copper-containing material. The lead frame 350 includes a die attach pad 351 having a die attachment site 352 (indicated by dashed line) and at least one ground lead 353 that extends from the pad 351. The lead frame 350 also includes an array of I/O leads 354 arranged about the die attach pad 351. In the depicted embodiment, the leads 354 extend in two opposite directions defining the dual in-line nature of the lead frame. The inventors point out that the leads 353, 354 can optionally include encapsulant locks or openings (e.g., 353a, 354a). These openings in the leads enable encapsulant to flow through the openings and then, upon curing, the encapsulant provides a mechanical locking effect which locks the encapsulant more securely to the lead frame 351 and increases resistance to delamination. This increases the structural integrity of the resultant package and greatly improves the moisture resistance of the package.

As discussed, such lead frames 350 include "up-set" bonding pads 355 (roughly delineated by the alternating dotted dashed line) that is electrically connected with the die attach pad 351. The "up-set" bonding pads 355 are electrically and structurally connected to the die attach pad 351. In the depicted embodiment this connection is made using conductive tabs 355t (also referred to herein as "upset" tie-bars). The up-set bonding pad 355 also includes a raised bonding surface 356 suitable for the affixing of wire bonds and arranged to include at least one mold flow aperture 357 between the die attachment site 352 and the bonding surface 356. The up-set bonding surfaces can be on any two sides of the frame. However, the bonding surfaces 356 are commonly arranged on opposing sides of the die attach pads of such dual in-line embodiments. These mold flow apertures enable a sufficient flow of encapsulant (epoxy, plastic, or other molding material) to flow through the aperture and surround the up-set bonding pad 355 and bonding surface 356 as well as any associated wires bonded to the bonding surfaces. The cured and hardened encapsulant stabilizes the encapsulant in the region near the bonding surfaces and locks the associated wire bond connections securely in position aiding in the prevention of delamination based wire bond failures.

The leads 353, 354 are temporarily coupled to the lead frame 300 using tie bars 358. Here, the temporary tie bar 358 connects the I/O leads 354 to the ground leads 353 which is secured to the die attach pad 351. Alternatively, more tie bars can be used to couple the leads with the die attach pad. The tie bars 358 typically lie outside the region of the lead frame that will be encapsulated by the package envelope. Thus, after the lead frame 350 is assembled and encapsulated, the tie bars 58 can be easily cut away to singulate the leads 353, 354 leaving them extending outward from the package.

In the depicted embodiment, the ground lead 353 includes a widened bonding area that extends from the die attach pad 351. Ordinarily, such ground leads are narrow and linear in shape. The inventors have discovered that an expanded ground lead shape can increase the area available for ground lead wire bonding (by creating more surface configuration) and decrease encapsulant delamination near the ground lead wire bonds. Thus, a shaped ground lead is enables greater reliability in the resultant package. Thus, the depicted ground lead 353 includes a bonding surface that can support one or more wire bonds from lead to a mounted die. The ground lead 353 may also feature a mold flow aperture (such as 353a) to further enhance mold locking with the encapsulant. Thus, the leads 353, 354 of some embodiments include mold flow apertures 353a, 354a, that lie within the encapsulant boundary (i.e., such that they are inside the mold envelope when the package is complete). These apertures enable the liquid encapsulant to flow through the apertures during encapsulation so that the hardened encapsulant locks the leads in place and solidly secure associated wire bonds to reduce the incidence of delamination failures.

Additionally, embodiments of the invention can include securement features 370 for securing the lead frame 350 to a mounting jig. For example, these features can include, but are not limited to, one or more holding arms 370 extending from the lead frame to attach the lead frame to a mounting jig. The secured lead frame enables effective mounting of a die onto the die attach pad, effective wire bonding, and effective encapsulation to form the final package. In the embodiment depicted in FIG. 3(b), a lead frame 350 is shown with two holding arms 370. More (or fewer) such features 370 can be added in accordance with the needs of the associated lead frame. As will be apparent to those of ordinary skill, many different features can be employed to enable the frame to be secured to a fixture.

Finally, the inventors point out that the bonding surfaces 356 of the up-set tie bar can be elevated above a plane defined by the die attach pad 351. This can be facilitated by the conductive tabs 355t which support the surface 356 above the die attach pad 351. Moreover, a bonding surface portion of the ground leads 353 or the I/O leads 353 can also be raised above the plane defined by the die attach pad 351. The invention does not require these raised features, the inventors only suggest that some embodiments of the invention can employ these raised features to advantageous effect.

In one non-limiting example, the lead frame can have the following example dimensions. An example die attach pad is about 6 millimeters (mm) by 5.5 millimeters. This of course can be of any necessary size as required by the user. Additionally, the bonding surface can be about 3.5 mm by about 0.6 mm, with a large variety in possible sizes also being contemplated by the inventors.

Figure 4A:
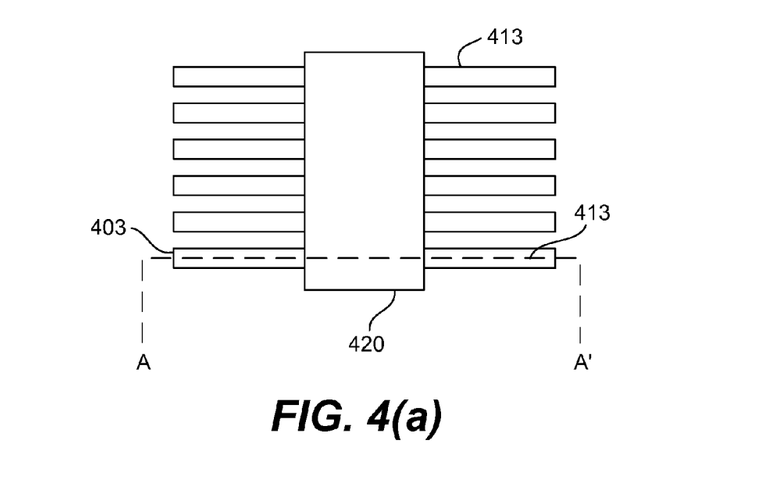
Figure 4B:
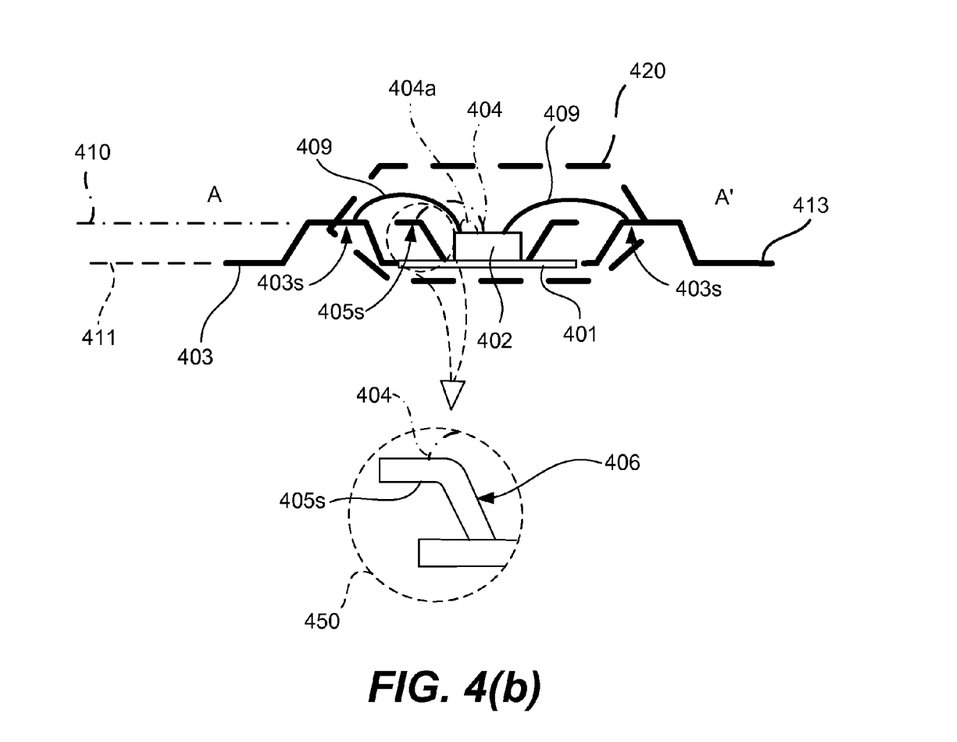

FIG. 4(a)-4(b) are simplified views of an encapsulated dual in-line type package constructed in accordance with the principles of the invention. Although depicted here as a simple twelve lead dual inline package, the inventors contemplate that any number of leads may be employed using the lead frame and package embodiments described herein. In FIG. 4(a) an exemplar completed package is shown.

FIG. 4(b) is a side section view showing the interior position of the lead frame in a typical package embodiment. The package encapsulant 420 is shown encapsulating the electronic components to complete the package. Such encapsulants are comprised of many materials. Typically, these materials are electrically insulative molding materials. Examples, include, but are not limited to, plastics, epoxies, b-stageable materials, low-CTE materials, and any encapsulant and molding materials used by those of ordinary skill to encapsulate electronic packages. The package includes an integrated circuit die 402 mounted on a die attach pad 401 (such as illustrated in the example of FIG. 3(a) or 3(b)) for example using die attach epoxy. The plane of the die attach pad 401 defines a die attach plane 411. A number of ground leads 404, 404a, 409 are illustrated (the alternating dot/dash lines). Some of the ground leads 404a can be bonded to the die attach pad 402. Alternatively, the die can be directly bonded to the DAP 401 in some embodiments. Also, a ground wire 409 can be wire bonded to the die 402 and to a bonding surface 403s of a grounding lead 403. Also, ground leads 404 can be bonded between the die 402 and the raised bonding surface 405s of an up-set bonding pad 406. The inventors also point out, that in the depicted embodiment, the bonding surface 403s of the ground lead 403 defines a raised lead plane 410 that is above the illustrated die attach plane 411. The inventors point out that the input/output (I/O) contacts 413 can also feature raised wire bonding contact points 413s.

Further referring to FIG. 4(b), an expanded view of the die 402 wire bonded 404 (grounded) to the bonding surface 405s of the up-set bonding pad is shown. The bonding support 405s of the up-set bonding pad is also in a raised plane 412. This raised plane 412 can be the same as the lead plane 410 however it is not required to be so.

The inventors point out that although the depicted embodiment has arranged the wire bonding surface 403s of the ground lead 403 and the bonding support 405s above the plane defined by the die attach pad (411), such is not strictly required to practice the invention. In one embodiment having such raised surfaces, the inventors contemplate that a thin metals or a conductive sheet be used to form the lead frame. This thinness will enable the lead frame to be bent into an appropriate shape in an ordinary stamping process. For example, in one implementation the lead frame is constructed of a copper or copper alloy material in the range of about 10 mils to about 20 mils thick. The inventors understand that a lead frame having a thickness of about 15 mils thick is suitable many embodiments of the invention.

Further referring to the illustration window 450 of FIG. 4(b), the up-set tie bar includes the aperture 406 configured to enable encapsulant to flow around the bonding support 405s to increase adhesion to the up-set tie bar and the wire bonds attached thereto. This configuration has resulted in substantial increase in adhesion of the encapsulant to the lead frame and a reduction in the number of delamination failure of the associated device package.

Figure 5:
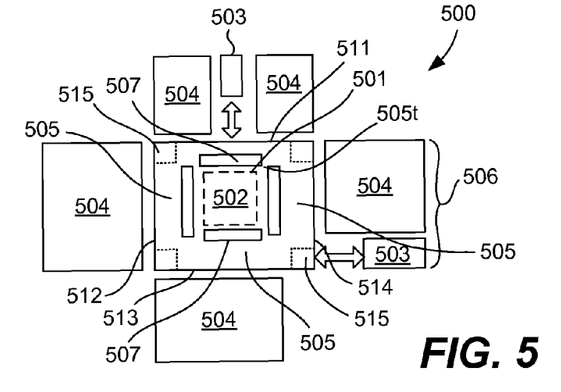
FIG. 5 is plan schematic view of a quad lead frame embodiment constructed in accordance with the principles of the invention.

FIG. 5 is a schematic block depiction of another embodiment of a lead frame implementation suitable for use with quad pack or four sided applications of the invention. Such a lead frame can be used for surface mounted semiconductor packages. This is especially useful with small profile packages. Typical examples of such packages include QFP packages and QFN's. For example, CQFP (Ceramic Quad Flat Package), FQFP (Fine Pitch Quad Flat Package), HQFP (Heat sinked Quad Flat Package), LQFP (Low Profile Quad Flat Package), MQFP (Metric Quad Flat Package), PQFP (Plastic Quad Flat Package), SQFP (Small Quad Flat Package), TQFP (Thin Quad Flat Package), VQFP (Very small Quad Flat Package), VTQFP (Very Thin Quad Flat Package), and also BQFP (Bumpered Quad Flat Package), BQFPH (Bumpered Quad Flat Package with heatspreader), and can be applied to many other packages. The lead frame 500 is formed of a conductive material (e.g. metal) and in one particular embodiment is made from a copper material. The lead frame 500 includes a die attach pad 501 having a die attachment site 502 and at least one ground lead 503 that either extends from the pad or is otherwise in electrical communication with the pad 501 (e.g., connected via wire bonds). The lead frame 500 further includes a plurality of I/O leads 504 that extend out from the die attach pad so that they can protrude from a final encapsulated package on either side of the die attach pad 501. Typical, but not exclusive, examples of such leads are shown as I/O leads 354 of FIG. 3(b) as well as elsewhere. The I/O leads 504 and the ground leads 503 can collectively be referred to as leads or contacts 506. In common embodiments, each side includes at least one leads 306. Common implementations include at least eight leads 506. Other example applications include, but are not limited to, 8, 12, 14, 15, 20, 24, 28, 44, 48, or 56 lead embodiments.

The lead frame 500 further includes at least one "up-set" bonding pad 505 that is electrically connected with the die attach pad 501. This depicted embodiment includes four such up-set bonding pads 505, one on each of the sides of the die attach pad 501. As shown here, the "up-set" bonding pads 505 are electrically and structurally connected to the die attach pad 501 using conductive tabs 505t. The up-set bonding pads 505 include bonding surfaces, each configured to support a plurality of wire bonds and also includes a large mold flow aperture 507 between the die attachment site 502 and the bonding surface. The mold flow apertures enable flows of encapsulant to flow through the apertures and surround any associated wires bonded to the bonding surfaces. Thus, upon curing, the encapsulant locks the structure together increasing resistance to delamination and greatly improves the moisture resistance of the package. Tie bars can form part of the leads 506 to temporarily couple the leads 506 to the lead frame 500. Once the lead frame 500 is assembled and encapsulated, such tie bars can be easily cut away leaving the leads 506 extending outward from the package.

In some embodiments of the invention the lead frame further includes one or more holding features (schematically illustrated as 515) that can extend from the leadframe 500 to secure it to a mounting jig. This will enable, among other things, effective mounting of a die onto the die attach pad, effective wire bonding, and effective encapsulation to form the final package. In the embodiment depicted in FIG. 5, the lead frame 500 is shown with four schematically depicted holding features 515. More (or fewer) can be added in accordance with the needs of the associated lead frame. As will be apparent to those of ordinary skill, many different holding features can be employed in accordance with the invention.

Figure 6A:
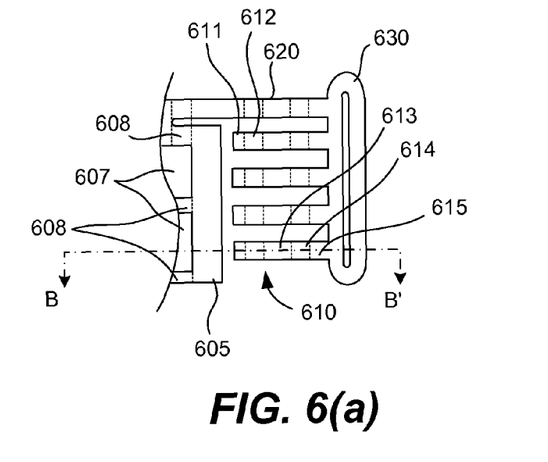
Figure 6B:
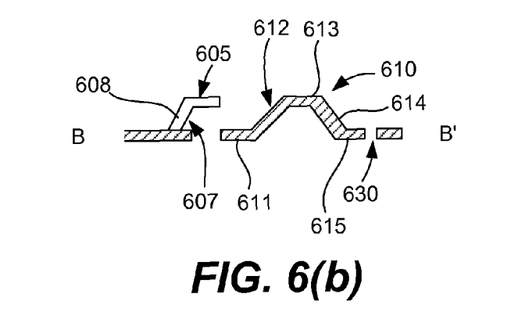

A different view of a portion of such a leadframe 600 is illustrated in FIGS. 6(a) and 6(b). An up-set bonding surface 605 is defined by a pair of apertures 607 and tabs 608 that raise the bonding surface 605 above the plane defined by the die attach pad. FIG. 6(b) also presents a cross section view along B-B'. The leadframe 600 is shown with a ground lead 620 and a plurality of ground leads 610 joined by a tie bar 630. The I/O lead 610 in this embodiment includes a first portion 611 that is in the die attach plane, a second portion 612 that raises the lead to a higher level. Wire bonds can be made to the raised portion 613. A descending portion 614 extends into another lower portion 615 which is connected to the tie bar 630.

Figure 7:
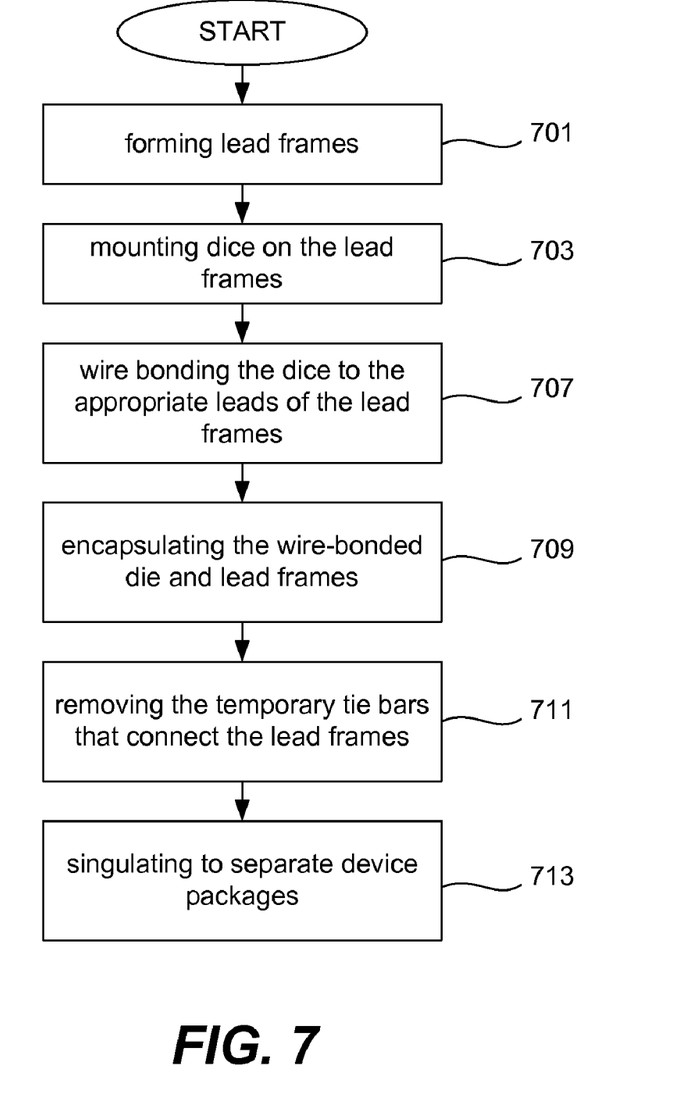
FIG. 7 is a flow diagram depicting one suitable method embodiment constructing a package embodiment in accordance with the principles of the present invention.

FIG. 7 expresses one typical process for forming such packages. The process begins by providing the lead frames (Step 701). Commonly, this will be accomplished by stamping out the lead frames from a thin sheet of conductive material and then providing them for use. In one example, a 15 mil thick sheet of copper can be stamped into an appropriate configuration using standard stamping processes known to those having ordinary skill in the art. For example, a lead frame having a die attach pad, a raised up-set bonding pads, ground leads (optionally having a raised portion), and I/O leads (also optionally having a raised portion) is formed. In one example, a copper sheet can be stamped to form the lead frame in accordance with the principles of the invention.

A die can be mounted to a die attachment site on the die attach pad (Step 703). The die is then wire bonded appropriately to selected I/O leads, the ground lead, and the up-set bonding pad using standard wire bonding processes (Step 707).

The lead frame and associated wire bonded elements is then treated with encapsulant material to seal the die and wire bonds and portions of the leads (Step 709). Common encapsulation processes can be used to seal the package. Many package molding materials known to those having ordinary skill in the art can be used to seal the package. Once cured and appropriately hardened, the packages can then have the temporary tie bars removed from the leads (ground and I/O) to enable separate connection of the leads. The packages are then singulated to separate the devices into separate device packages (Steps 711 and 713). The inventors point out that Steps 709, 711, & 713 can be performed in any order or, alternatively, be performed together. The completed package, due to the presence of the encapsulant filled mold flow apertures is now capable of performing at better than the JEDEC Moisture Sensitivity Level 3 standard. In fact embodiments of the devices disclosed here can perform at the JEDEC Moisture Sensitivity Level 1 standard.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein. The inventors further indicate that, although process steps, method steps, algorithms or the like may be described in a sequential order, such processes, methods and algorithms may be configured to work in alternate orders. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred.

We claim:

1. A lead frame for a semiconductor package, the leadframe comprising:
   a die attach pad having a die attachment site and edges about the periphery of the die attach pad with further including at least one up-set bonding pad raised out of a plane defined by the die attach pad and is configured to support a plurality of wire bonds, each up-set bonding pad further defining a mold flow aperture between the die attachment site and the associated bonding pad such that the mold flow aperture is defined by a space framed by a pair of conductive tabs that link the up-set bonding pad with the die attach pad, the mold flow aperture arranged to allow molding material that is injected around the lead frame to flow through the mold flow aperture to help lock the molding material around the bonding support surface on the up-set bonding pad;
   a ground lead extending from the die attach pad; and
   a plurality of input/output (I/O) leads having proximal and distal ends, the leads arranged about at least one edge of the die attach pad such that the distal end of each lead extends outwardly from an edge of the die attach pad.

2. A lead frame as recited in claim 1, wherein an up-set bonding pad is arranged on two sides of the die attach pad.

3. A lead frame as recited in claim 2, wherein the up-set bonding pads are arranged on two opposing sides of the die attach pad.

4. A lead frame as recited in claim 1, wherein an up-set bonding pad is arranged on four sides of the die attach pad.

5. A lead frame as recited in claim 1, wherein the number of ground and I/O leads comprise at least 8 leads.

6. A lead frame as recited in claim 1, wherein number of ground and I/O leads comprise 8, 12, 14, 15, 20, 24, 28, 44, 48, or 56 leads.

7. A lead frame as recited in claim 1, wherein a bonding pad is characterized by a plurality of mold flow apertures arranged between the die attachment site and said bonding pad.

8. A lead frame for a semiconductor package, the leadframe comprising:
   a die attach pad having a die attachment site and edges about the periphery of the die attach pad with further including at least one up-set bonding pad raised out of a plane defined by the die attach pad and is configured to support a plurality of wire bonds, each up-set bonding pad further defining a mold flow aperture between the die attachment site and the associated bonding pad;
   a ground lead extending from the die attach pad;
   a plurality of input/output (I/O) leads having proximal and distal ends, the leads arranged about at least one edge of the die attach pad such that the distal end of each lead extends outwardly from an edge of the die attach pad; and
   wherein each up-set bonding pad is configured such that it is electrically connected with the die attach pad by conductive tabs.

9. A lead frame as recited in claim 8, wherein the mold flow aperture is defined by a space between the bonding pad, the pair of conductive tabs, and the die attach pad.

10. A lead frame as recited in claim 8, wherein the bonding pad is raised by the tabs above a plane defined by the die attach pad.

11. A lead frame as recited in claim 1, wherein the die attach pad is about 15 thousandths of an inch thick.

12. A lead frame as recited in claim 1, wherein the die attach pad has a thickness of about 15 thousandths of an inch; and
   wherein the up-set bonding pad is configured such that it is electrically connected with the die attach pad by a pair of conductive tabs that are about 15 thousandths of an inch thick and wherein the bonding pad is raised by the tabs above a plane defined by the die attach pad.

13. A lead frame as recited in claim 1, wherein the die attach pad further includes at least one holding arm that is configured to secure the lead frame to a fixture during processing.

14. A lead frame as recited in claim 1, wherein the plurality of I/O leads arranged about the die attach pad are configured for wire bonding to a die.

15. A lead frame as recited in claim 14 wherein the plurality of I/O leads are arranged such that the proximal end of each lead does not contact the die attach pad.

16. A lead frame as recited in claim 1 wherein the plurality of ground and I/O leads further include at least one disposable tie bar that temporarily couples the leads together with the die attach pad.

17. A semiconductor package comprising:
   a lead frame having:
      (i) a die attach pad having a die attachment site;
      (ii) a ground lead that extends from the die attach pad;
      (iii) a plurality of input/output (I/O) leads arranged about the die attach pad, said leads extending away from the die attach pad; and
      (iv) an up-set bonding pad extending from the die attach pad, the up-set bonding pad including a bonding surface that is arranged above the plane of the die attach pad and configured to support a plurality of wire bonds and including at least two tabs that structurally connect the bonding surface with the die attach pad and configured such that the a spaced between the die attach pad, the bonding surface, and the at least two tabs define a mold flow aperture between the die attachment site and the up-set bonding pad;
   a semiconductor integrated circuit die mounted on the die attachment site of the die attachment pad;
   a set of wire bonds comprising at least one wire bond electrically connecting the die to at least one of: the up-set bonding pad; the ground lead, and at least one of the I/O leads; and
   a mold envelope encapsulating the package with a mold material, the envelope encapsulating the die; an upper portion of the attach pad; a portion of the ground lead; portions of the I/O leads, the up-set bonding pad; and the set of wire bonds and wherein the mold materials fills the mold flow aperture to form a mold locking feature.

18. The semiconductor package of claim 17, wherein the package includes up-set bonding pads arranged on two sides of the die attach pad.

19. The semiconductor package of claim 18, wherein the up-set bonding pads are arranged on two opposing sides of the die attach pad.

20. The semiconductor package of claim 17, wherein the package is configured to include an up-set bonding pad on four sides of the die attach pad.

21. The semiconductor package of claim 19, wherein the package defines a dual in-line semiconductor package constructed in compliance with the JEDEC Moisture Sensitivity Level 1 standard.

22. The semiconductor package of claim 21, wherein the package defines a small outline package including but not limited to a SOIC, PSOP, TSOP, TSSOP, SSOP, or an MSOP.

23. The semiconductor package of claim 20, wherein the package defines a QFP (Quad Flat Pack) semiconductor package constructed in compliance with the JEDEC Moisture Sensitivity Level 1 standard.

24. The semiconductor package of claim 20, wherein package defines a QFN semiconductor package constructed in compliance with the JEDEC Moisture Sensitivity Level 1 standard characterized in that the ground and I/O leads comprise contacts that do not extend out of the sides of the package but rather present contacts at the bottom of the package.

25. The semiconductor package of claim 23, wherein the OFP package comprises one of a CQFP, FQFP, HQFP, LQFP, HQFP, PQFP, SQFP, TQFP, VQFP, and VTQFP semiconductor package.

26. The semiconductor package of claim 19, wherein at least one up-set bonding pad defines more than one mold flow aperture in the space between the said up-set bonding pad and the die attach pad.

27. The semiconductor package of claim 17, wherein the lead frame further includes: (v) at least one holding arm extending from the die attach pad, the holding arm configured to secure the lead frame to a fixture.

28. The semiconductor package of claim 17, wherein the plurality of ground and I/O leads further include at least one disposable tie bar that temporarily couples the leads together with the other portions of the lead frame.

29. A method of forming a semiconductor package comprising:
   providing a lead frame with,
      a die attach pad having a die attachment site;
      a plurality of leads arranged about and extending away from the die attach pad, the leads including at least one ground lead and a plurality of input/output (I/O) leads; and
      an up-set bonding pad extending from the die attach pad, the up-set bonding pad including a bonding surface that is arranged above the plane of the die attach pad and configured to support a plurality of wire bonds and disposed to define a mold flow aperture between the die attachment site and the up-set bonding pad;
   mounting a semiconductor integrated circuit die on the die attachment site of the die attachment pad;
   wirebonding so that at least one wire bond electrically connecting the die to at least one of: the up-set bonding pad; the ground lead, and at least one of the I/O leads; and
   encapsulating the package with a mold material that forms a mold envelope that encapsulate the die; an upper portion of the die attach pad; a portion of the ground lead; portions of the I/O leads, the up-set bonding pad; and the wire bonds and wherein the mold materials fills the mold flow aperture to form a mold locking feature.

30. The method recited in claim 29, wherein the lead frame includes up-set bonding pads arranged on two sides of the die attach pad.

31. The method recited in claim 30, wherein the up-set bonding pads are arranged on two opposing sides of the die attach pad.

32. The method recited in claim 29, wherein the lead frame includes an up-set bonding pad on four sides of the die attach pad.

33. The method recited in claim 31, wherein the package is constructed in compliance with the JEDEC Moisture Sensitivity Level 1 standard.

34. The method recited in claim 33, wherein the package defines a small outline package including but not limited to a SOIC, PSOP, TSOP, TSSOP, SSOP, or an MSOP.

35. The method recited in claim 32, wherein the package defines a QFP (Quad Flat Pack) semiconductor package constructed in compliance with the JEDEC Moisture Sensitivity Level 1 standard.

36. The method recited in claim 32, wherein package defines a QFN semiconductor package constructed in compliance with the JEDEC Moisture Sensitivity Level 1 standard characterized in that the ground and I/O leads comprise contacts that do not extend out of the sides of the package but rather present contacts at the bottom of the package.

37. The method recited in claim 35, wherein the OFP package comprises one of a CQFP, FQFP, HQFP, LQFP, HQFP, PQFP, SQFP, TQFP, VQFP, and VTQFP semiconductor package.

38. The method recited in claim 31, wherein at least one up-set bonding pad defines more than one mold flow aperture in the space between the said up-set bonding pad and the die attach pad.

39. The method recited in claim 29, wherein the lead frame further includes: (v) at least one holding arm extending from the die attach pad, the holding arm configured to secure the lead frame to a fixture.

40. The method recited in claim 29, wherein providing a lead frame comprises providing a lead frame with a tie bar that temporarily couples the plurality of ground and I/O leads together; and wherein the method further includes separating the tie bars from the leads to singulate the leads.

41. The package recited in claim 20 wherein the package can be further processed in a JEDEC Moisture Sensitivity Level 1 environment.

42. The package recited in claim 1 wherein the up-set bonding pad is directly connected to an edge of the die attach pad by a pair of conductive tabs such that the mold flow aperture is defined about its outer edge by the die attach pad, the up-set bonding pad and the pair of conductive tabs to form an elongate mold flow aperture; and
   wherein at least some of the I/O leads have mold flow aperture openings formed within the leads.

* * * * *